United States Patent [19]

Bluzer

[11] Patent Number: 4,731,640
[45] Date of Patent: Mar. 15, 1988

[54] HIGH RESISTANCE PHOTOCONDUCTOR STRUCTURE FOR MULTI-ELEMENT INFRARED DETECTOR ARRAYS

[75] Inventor: Nathan Bluzer, Silver Spring, Md.

[73] Assignee: Westinghouse Electric Corp., Pittsburgh, Pa.

[21] Appl. No.: 864,940

[22] Filed: May 20, 1986

[51] Int. Cl.⁴ .......................................... H01L 27/14
[52] U.S. Cl. ...................................... 357/30; 358/16; 358/58
[58] Field of Search ......... 357/30 B, 30 I, 30 Q (U.S. only), 357/30 R (U.S. only), 30 D, 30 H, 58, 16

[56] References Cited

U.S. PATENT DOCUMENTS

| | | | |
|---|---|---|---|
| 3,372,317 | 3/1968 | Yamashita | 357/30 D |
| 3,508,961 | 4/1970 | Makino et al. | 357/30 B X |
| 3,842,274 | 10/1974 | Greene et al. | 250/330 |
| 3,878,105 | 4/1975 | Palmer | 357/30 D X |
| 3,988,774 | 10/1976 | Cohen-Solal et al. | 357/30 |
| 3,995,159 | 11/1976 | Elliot | 250/370 |
| 4,000,508 | 12/1976 | Hager et al. | 357/61 |
| 4,053,919 | 10/1977 | Andrews, II et al. | 357/30 B |
| 4,081,819 | 3/1978 | Wong | 357/30 |
| 4,132,999 | 1/1979 | Maille et al. | 357/30 |
| 4,137,544 | 1/1979 | Koehler | 357/30 |
| 4,206,003 | 6/1980 | Koehler | 148/1.5 |
| 4,223,234 | 9/1980 | Levine | 357/30 R X |
| 4,598,305 | 7/1986 | Chiang et al. | 357/30 I X |

Primary Examiner—Martin H. Edlow
Assistant Examiner—William A. Mintel
Attorney, Agent, or Firm—W. G. Sutcliff

[57] ABSTRACT

A high resistance, low noise, multi-layer, thin film photoconductive, infrared detector operable to be easily coupled to charge couple devices; having an enhanced photoconductive gain due to the use of a bias voltage across a depletion layer of n-doped HgCdTe resulting in the flow of electron charge in the bulk of depletion region and the flow of electron holes along the surface of the depletion region. In one embodiment of this invention an additional layer is incorporated into the structure having specific thickness, of ¼ of the wavelength of the energy received. This additional layer of material behaves as resonant cavity enhancing the quantium efficiency. In a further embodiment, a configuration for a high resistance photoconductor detector structure is disclosed utilizing a cylindrical topography to circumvent lateral edge problems in the high resistance photoconductive structure. Finally, arrays composed of a multiplicity of the described detectors are taught using the cylindrical topography embodiment.

48 Claims, 12 Drawing Figures

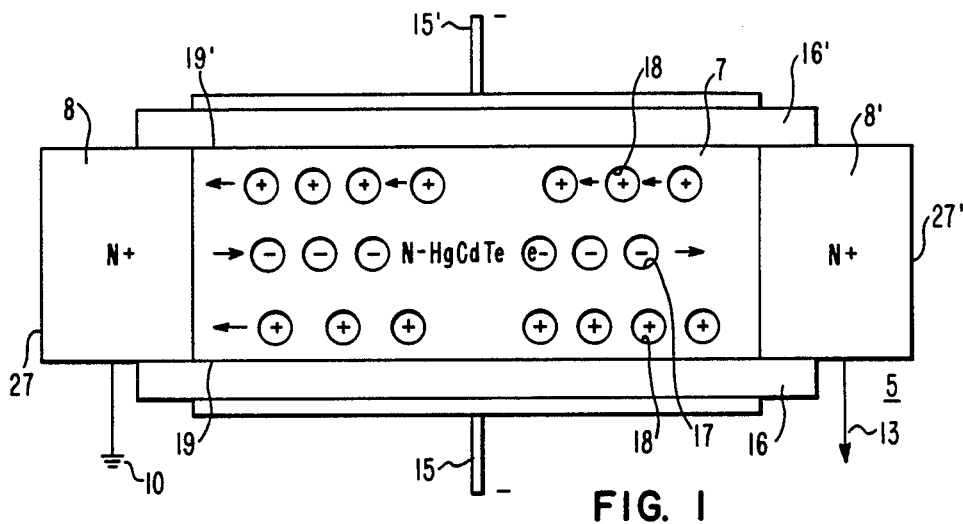
FIG. 1
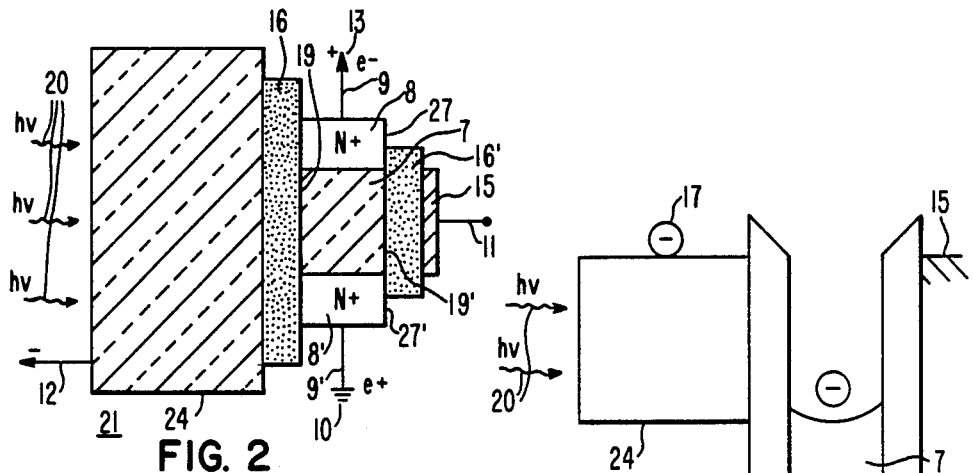
FIG. 2
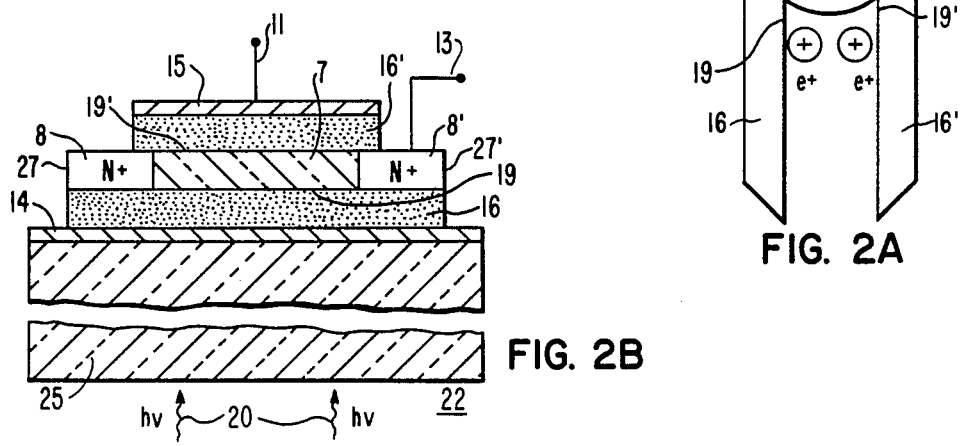
FIG. 2A
FIG. 2B

HIGH RESISTANCE PHOTOCONDUCTOR STRUCTURE FOR MULTI-ELEMENT INFRARED DETECTOR ARRAYS

BACKGROUND OF THE INVENTION

1. Field of the Invention:

The present invention relates to a high resistance, low noise, high quantum efficiency photoconductor detector structure utilizing layers of photoconductive materials of predetermined band gaps operable to achieve high resistance detectors for use in multi-element detector arrays.

2. Description of the Prior Art:

The first operating infrared detection systems utilized detector arrays made of photoconductive mercury cadmium telluride. For example, these detectors consisted of a small slab of mercury cadmium telluride, 2 mils square by approximately 10 microns thick with two contacts one at each end of the photoconductor. The resistance of this material was approximately 50 to 100 ohms at 77° Kelvin.

When exposed to infrared photons, the resistance of this mercury cadmium telluride photoconductive slab changed. The resistance change was measured as a voltage change across each delineated photoconductive detector located in the slab. Because of the complexity of the readout electronics and the power consumed by each detector, only a small number of detectors could be included in an array. Each detector had a small resistance, of approximately 50 to 100 ohms. An amplifier was necessary to read-out the signal from the detector. Implicitly, the size of photoconductive detector arrays were constrained by the power consumptions necessary for amplifiers required to read-out the low resistance detectors. For example, if each mercury cadmium telluride photoconductive detector consumed about a milliwatt of power, then a large focal plane array with a thousand detectors, required several watts of cryogenic cooling power. Such large cryogenic requirements were impractical.

The first generation of infrared focal plane arrays comprising 100 to 200 photoconductive mercury cadmium telluride detectors were accommodated with read-out electronics and focal plane cryogenic with cooling power capabilities of approximately one watt.

The problem to be solved then, is the development of a large infrared array for use in second generation systems that will overcome the limitations inherent in photoconductive low resistance detectors, by an approach that provides an IR array having low focal plane cooling power requirements and less complex read-out electronics.

Photoconductive mercury cadmium telluride has the beneficial feature of photoconductive gain. This photoconductive gain allows the reading of each detector even though the detector resistance is very low. If the power required to cool a photoconductive focal plane array must be reduced, then the complexity associated with the read-out circuitry and the power consumed by each detector must also be reduced. Both of these improvements can be achieved if the resistance of each individual detector is increased sufficiently to eliminate the need for high power read-out circuits. Replacement of high power consuming read-out circuits with low power read-out circuits (i.e., charge-coupled devices or switch capacitor type) is necessary for forming large infrared focal plane arrays.

Large focal plane arrays with high resistance infrared detectors is the prime motivation for the selection of photovoltaic type detectors. Photovoltaic detectors are diodes which when reversed-biased by several millivolts exhibit high resistance. Dependent upon the material quality and structure used, this resistance can increase from the 50 to 100 ohms range for photoconductive infrared detectors, to the kilo-ohm or gigaohm range for photovoltaic infrared detectors.

However, photovoltaic detectors do not have signal gain. Thus, by switching from photoconductive detectors to photovoltaic detectors we are replacing appreciable photoconductive gain with high resistance diodes having optimally unity photoconductive gain. The change from photoconductive to photovoltaic detectors is motivated by the need for an increased resistance detector which has low power consumption. However, this change on the focal is at the expense of the signal-to-noise ratio because with unity gain detectors all readout circuit noises become more significant and deleterious.

Poor signal-to-noise ratio may result from unity gain detectors. The noise from the processor and any shunting resistance across the detector becomes more significant. To maximize the signal-to-noise ratio, infrared photodiode arrays are needed with a high $R_oA$ product shunting resistance value and low excess noise when reversed biased. The $R_oA$ product is defined as the resistance of a photovoltaic detector biased at zero volts multiplied by its junction area. The necessary $R_oA$ value can be computed from the flux incident on the detector. In the 8–11.5 $\mu$m longwave infrared (LWIR) band, the photon flux from a 300K background is:

$$\Phi = 2 \times 10^{16} \text{ photons/cm}^2 \text{ sec.}$$

The required photodiode resistance ($R_D$) for achieving background limited imaging performance can be expressed as:

$$R_D \geq (4kT)/(2e^2 \Phi \eta A)$$

where,
  $\eta$ = detector quantum efficiency
  e = electronic charge
  k = Boltzmann's constant
  T = temperature in degrees Kelvin
  A = the detector's area For example, a 33 $\mu$m square detector operating at 77° K., the value of $R_D$ should be greater than $7.62 \times 10^5$ ohms or, the $R_oA$ product should be greater than 8.30 ohm-cm². Attainment of a high injection efficiency (needed for high S/N ratio) with a direct injection-detector-CCD coupling arrangement requires an even greater $R_oA$ product, i.e., greater than 20 ohm-cm².

In the existing detector technology, attainment of photovoltaic detectors with large $R_oA$ products (in the range of approximately 20 ohm-cm²) is very difficult. For detector operation in a low background environment, the insufficient $R_oA$ problems become worse because the required $R_oA$ products increase inversely with the photon flux. A preamplifier could be connected to each photovoltaic detector to circumvent the low $R_oA$ value but this requires inclusion of an amplifier which will increase the power consumption per each detector and thus for the entire focal plane array.

It is therefore desirable to increase the output signal levels produced by the infrared sensor, as obtained with photoconductive detectors, and thereby reduce the required $R_oA$ value. Conventional infrared photoconductors with large photoconductive gain have too low a resistance value causing two problems: (1) difficulty in coupling a photoconductive detector directly to a charge coupled device focal plane signal processor; and (2) the high power consumed by an appropriate focal plane signal processor. These problems; low $R_oA$ product, poor signal-to-noise ratio, and focal plane power consumption, can be solved with a new photoconductor device that has a higher resistance, e.g., greater than 10,000 ohms.

SUMMARY OF THE INVENTION

In accordance with the above requirements, the present invention, a high resistance thin film photoconductive detector structure is constructed comprising layers of p-doped and n-doped mercury cadmium telluride. This structure is intended for use in hig density, multi-element detector arrays providing high resistance detectors and facilitating coupling to focal plane read-out circuits like charge coupled devices.

Specifically, for high resistance photoconductors; coupling can be achieved by gate injection into charge coupled devices where the voltage change across the photoconductive detector will modulate a potential level of a gate in a fill and spill type charge coupled device input structure. No amplifiers are necessary between the charge coupled device's input port and the high resistance photoconductive detector; thereby achieving low power and simplicity in the detector read-out circuits.

This high resistance photocondutive (HRPC) detector structure consists of n-type mercury cadmium telluride infrared photosensitive layer disposed between two blocking regions; where said blocking regions confine the electrons and holes within the infrared photosensitive layer. The blocking regions are transparent to infrared radiation and prevent any substantial number of electrons or holes from leaving and/or entering the infrared photosensitive layer. The entire three-layer structure is formed on a semiconductor substrate for mechanical support. An infrared transparent substrate is preferable, because it offers the possibility of backside illumination of the HRPC detector.

Two N+ doped contact regions areas, located in the n-type mercury cadmium telluride infrared photosensitive layer, provide two terminals for read-out of the high resistance photoconductive infrared detector.

Finally, a conductive layer is disposed on the front side of this detector structure and the substrate becomes the backside of the high resistance photoconductive detector. In some high resistance photoconductive detector embodiments, a thin conducting layer may be inserted between the substrate and the blocking region beneath the n-type HgCdTe photosensitive layer. The additional conducting layer over the substrate, and the top conducting layer over the HRPC detector increase the photoconductor's resistance as measured between the two N+ doped contact areas.

During photodetector operation, the increase of the resistance of the n-type HgCdTe photosensitive layer is accomplished by electrically depleting majority carriers, electrons, out of the n-type photosensitive mercury cadmium telluride layer. An electric field for depleting majority carriers out of the n-type photosensitive layer is produced by applying the proper bias potential to the top conductive layer and to the substrate. The proper bias is a negative potential applied to the top conductive layer and the substrate relative to the (N+) photoconductor's contact region held at the lowest potential. This applied potential will repel electrons from the surfaces of the n-type HgCdTe photosensitive layer, causing depletion of majority carriers within the n-type photosensitive HgCdTe layer. Depletion will start from both the top and back sides of the n-type photosensitive HgCdTe layer and, as the applied potential to the top conductive layer and substrate becomes more negative, more electrons will be depleted out of the n-type photosensitive layer; further reducing the electrical thickness of the conducting channel that is of the undepleted center region within the n-type photosensitive layer. As the undepleted center regions is reduced by the action of the applied depleting potential, the resistance of the n-type photosensitive layer will increase. This resistance increase occurs between the two n+ contact regions which provide contact to the n-type HgCdTe photosensitive layer.

Electrons within the n-type HgCdTe photosensitive layer are electrostatically repelled by the fields produced by the top conductive layer and substrate. Holes will be attracted to the top conductive layer and the substrate. The top conductive layer and the substrate are comparable to two parallel field plates between which the n-type photosensitive HgCdTe layer is disposed. Holes attracted by these two field plates will remain within the n-type HgCdTe photosensitive layer because of the two blocking regions disposed between the n-type photosensitive layer and the two layers acting like parallel field plates.

In summary, the fields produced by the biased substrate and the top conductive layer will attract holes toward the top and back surfaces of the n-type HgCdTe photosensitive region while simultaneously repelling electrons and confining the electrons to the undepleted center portion of the n-type HgCdTe photosensitive layer.

During detector operations electrons and holes formed within the n-type HgCdTe photosensitive layer are removed from that layer through the terminals that contact the photosensitve region. Infrared photons to which the high resistance photoconductive detector is sensitive will produce electron hole pairs within the n-type HgCdTe photosensitive layer. Because of the applied electric fields, spatial separation of electron and holes will occur in the photosensitive layer. Electrons will be transported between the two N+ contact regions by flowing from the negative N+ contact node through the n-type HgCdTe photosensitive layer to the more positive N+ contact node. Holes will flow in the opposite direction than the electrons. Holes will be removed by recombination with electrons at the negative N+ contact region or via a special P+ region formed adjacent to the negatively biased N+ contact region and within the n-type HgCdTe photosensitive layer.

In this high resistance photoconductive detector, large photoconductive gain will occur because of the mobility difference between the photogenerated electron and hole carriers. Electrons have a higher bulk mobility than the bulk mobility of holes in the n-type HgCdTe photosensitive layer. Thus for the same field, electrons will be transported within the n-type HgCdTe photosensitive layer much faster than the holes. The difference in the electron versus hole mobility is further enhanced by the effect of the electric field that causes electrons to be transported in the bulk and the hole transport at the surfaces of the n-type HgCdTe photosensitive region.

As each electron-hole pair is photogenerated by an infrared photon, the electron is quickly removed from the n-type HgCdTe photosensitive layer at the positively biased N+ region while the hole continues to move towards the negatively biased N+ region for removal through recombination or via a specially provided P+ contact. The removed electron with the remaining hole produces a charge inbalance in the n-type HgCdTe photosensitive layer, as a result, charge balance is re-established as a second electron enters from the negative N+ contact region into the n-type HgCdTe photosensitive layer. Re-establishment of charge balance will occur within a time equal to the lattic relaxation time constant of the n-type HgCdTe photosensitive layer. Hence, on the average for each transported hole, many more electrons will be transported through the n-type HgCdTe photosensitive region.

The number of electrons transported for each photogenerated hole is called the photoconductive gain and for the high resistance photoconductive detector (HRPC) this is represented as ratio of the electron to hole mobility. Conventionally the definition of photoconductive gain is the hole life time divided by time needed for an electron to move across the photoconductor, i.e., between the N+ regions. However, because in the high resistance photoconductive detector an internal field separates the photogenerated electron-hole pairs, recombination within the n-type photosensitive region is severely inhibited thereby making the hole lift time equal to the time required to remove the hole from the n-type photosensitive region. The hole or electrons must move on the average the same distance therefore the photoconductive gain is simply the ratio of their respective mobilities.

The enhanced photoconductive gain made possible in the high resistance photoconductive detectors by the separation and transport of holes (at the surface) and electrons (within the bulk) in the n-type HgCdTe photosensitive layer also, results in lower noise. A photoconductor exhibits generation-recombination noise because electrons can recombine with holes since both are within the same semiconductor volume. In the high resistance photoconductive detector, depletion fields will spatially separate the electrons and holes, thereby severely inhibiting recombination and the noise associated with recombination. Hence, the improvement achieved in the high resistance photoconductive detector as a result of decreased noise is lowered by a $\sqrt{2}$, i.e., the generation-recombination noise is reduced only to a generation noise. Such a lower noise level occurs in photovoltaic detectors that have only generation noise and no recombination noise.

Thus, the high resistance photoconductive detector not only provides improved high resistance and higher photoconductive gain but improved noise performance. The lower noise level is normally found in photovoltaic detectors which do not exhibit photoconductive gain.

Consistent with the aim of making high resistance detectors, the high resistance photoconductive detector is made as thin as possible, to increase its resistance, while maintaining a high optical absorption, i.e., high quantum efficiency. The thickness proposed for this detector is thinner than the thicknesses usually used in conventional photoconductors.

This thinner film structure is made possible by utilizing the concept of resonant absorption. Specifically, the n-type HgCdTe photosensitive layer can be overlayed by a ¼ wavelength ($\lambda$) thick blocking region that in turn is overlayed by a reflecting film. Hence, when this structure is backside illuminated, i.e., exposed to infrared radiation, resonant absorption will occur in the n-type HgCdTe photosensitive layer at a wavelength "$\lambda$" whose one-quarter of a wavelength value is equal to the distance between the top reflecting layer and the center of the photosensitive layer. Narrow resonant absorption bandwidth can be achieved if the distance between the top reflecting layer and the center of the photosensitive layer is made $\frac{3}{4}\lambda$, $5/4\lambda$, (i.e., an odd multiple of $\lambda/4$) thick. For a $\lambda/4$ thick layer, the resonant absorption bandwidth, will be the widest. Specifically, for a resonance wavelength of 10 $\mu$m, the absorption bandwidth will be between 8 $\mu$m to 12 $\mu$m. The combination of resonant absorption and the HRPC structure facilitates realization of a high quantum efficiency detector with a highest resistance.

BRIEF DESCRIPTION OF THE DRAWINGS

For a better understanding of the invention reference may be had to the preferred embodiment exemplary of the invention, shown in the accompanying drawings, in which:

FIG. 1 is a plan view illustrating the basic concept of electron and hole migration within the n-type mercury cadmium telluride photosensitive layer with blocking regions (insulating regions) above and below it. Two negatively biased gate regions, relative to the n-type photosensitive HgCdTe layer, are utilized for depleting the n-type HgCdTe layer center region of majority carriers (electrons) in accordance with the present invention;

FIG. 2 is a cross section of the preferred embodiment showing elements as found in FIG. 1;

FIG. 2A is a band structure diagram of the energy levels of the electrons in the structure of FIG. 2;

FIG. 2B is a cross section of an alternative embodiment showing elements as found in FIG. 1;

DESCRIPTION OF THE PREFERRED EMBODIMENTS

Figure 3:
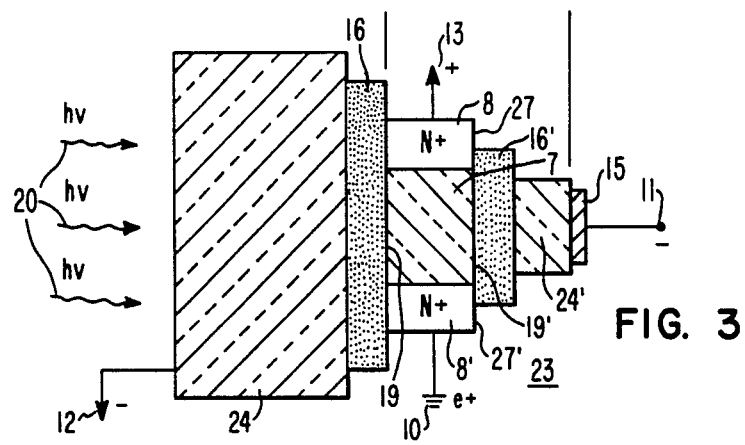
FIG. 3 is a cross section of yet another embodiment showing elements as found in FIG. 1 and further incorporating a resonant cavity structure.

FIG. 1 is a plan view illustrating the basic concept of electron and hole migration within a mercury cadmium telluride photosensitive structure 5 with attendant N+doped regions 8, 8′ as used in the present invention. The structure 5 in FIG. 1 consists of a thin layer of mercury cadmium telluride 7 photosensitive in the spectrum of interest, e.g., 8–12 μm. At each end of this layer of doped mercury cadmium telluride 7 is an N+ doped region 8, 8′ incorporated to provide ohmic contact to the HgCdTe layer 7. In structure 5 the n-type HgCdTe layer 7 is connected to one N+ doped region 8 grounded 10 and another N+ doped region 8′ biased positive 13. Two gates 15, 15′ biased at a negative potential relative to the N+ doped regions 8, 8′ are located directly opposite to one another with the n-doped HgCdTe layer 7 positioned in between gates 15, 15′. Two blocking regions 16, 16′ incorporated into the detector structure, prevent electrons 17 and holes 18 from being removed from layer 7 through gates 15, 15′. These blocking regions 16, 16′ may be made out of an insulating material or other appropriate semiconducting material. For the purpose of simplifying the description of how this photosensitive device 5 operates, the blocking regions 16, 16′ are assumed to be insulators and the supporting substrate for this device 5 has been omitted. Other embodiments of this concept would, for example, utilize a combination of n-doped and p-doped mercury cadmium telluride in lieu of insulators 16, 16′.

During detector operation, in addition to the bias applied to the two N+ diffusion regions 8, 8′, a bias will be applied to the two gates 15, 15′. The bias applied to the two gates 15, 15′ is negative relative to the lowest potential the photosensitive HgCdTe layer 7 is biased at, and this gate bias is more negative than the potential of the most negative N+ diffusion region 8. The electric field produced by the gates 15, 15′ will pass through the insulator regions 16, 16′ and partially deplete the n-type HgCdTe layer 7 of majority carriers. Thus electrons 17 will be repelled from the two interfaces 19, 19′ existing between the n-HgCdTe layer 7 and the insulators 16, 16′. Mobile electrons 17 within the n-type HgCdTe layer 7 will be subjected to two principal external forces, the depleting field force caused by the gates 15, 15′ and the external force caused by the bias across the HgCdTe photoconductor 7 produced by the potentials applied to the N+ diffusion regions 8. 8′.

A signal from the n-type HgCdTe photoconductive layer 7 will be obtained across the two N+ diffusion regions 8, 8′ as a change in the n-type HgCdTe layer's 7 resistance. The resistance of the n-type HgCdTe layer 7 will be modulated by the population of mobile carriers which will change with absorption of incident infrared photons. An increase in the mobile carrier density will reduce the resistance of the n-type HgCdTe layer 7, that is, for a fixed bias the current flowing between the two N+ diffusion regions 8, 8′ will increase. The amount of current increase produced by the incident infrared photons depend on the overall detector's 5 quantum efficiency and the photoconductive gain.

For optimal operation, the HgCdTe detector's 5 quantum efficiency should be as close to unity as possible and the detector's photoconductive gains should be as large as necessary. High photoconductive gain is achieved by arranging conditions wherein many electrons 17 are produced for each infrared photon absorbed by the detector structure 5. A high number of electrons 17, for each absorbed infrared photon, is facilitated by enhancing the mobility difference between electrons 17 and holes 18. Every photogenerated electron-hole pair (17, 18) in the n-type HgCdTe photosensitive layer 7 will be subjected to the external fields produced by the biases applied to the gates 15, 15′ and the N+ diffusion regions 8, 8′. Electrons 17 will move away from the two interfaces 19, 19′ toward the center of the n-type HgCdTe layer while concurrently moving away from the negatively biased N+ diffusion region 8 toward the positively biased N+ diffusion region 8′. Holes 18, subjected to the same fields will move in the opposite direction, that is, towards the interfaces 19′, 19 and towards the negatively biased N+ diffusion region 8. Because the electron 17 mobility is higher than the hole 18 mobility in n-type HgCdTe 7 mobile electrons 17 will be removed more quickly than holes 18. Thus, every electron-hole pair (17, 18) photogenerated in the n-type HgCdTe layer 7 will undergo transport where the electrons 17 move significantly faster than the holes 18. Once the electron 17 is removed, through the positive biased N+ diffusion region 8′, a charge imbalance is created within the HgCdTe crystal lattice 7 and this imbalance will cause another electron 17, from the more negative N+ diffusion region 8, to enter the n-type HgCdTe layer 7. Charge balance, i.e., electron 17 replacement within the n-type HgCdTe 7, will occur within the lattice's relaxation time that is equal to the product of the resistivity and dielectric constant of the n-type HgCdTe layer 7.

Replacement of the electrons 17 removed from the n-type HgCdTe layer 7 through the positively biased N+ region 8′ with electrons from the more negative N+ region 8 will continue until the hole is also removed from the n-type HgCdTe layer 7. The number of electrons removed, through the N+ region 8′, for each absorbed infrared photon is called the photoconductive gain. The value of the photoconductive gain can be calculated by computing how many electrons 17 are removed for each photogenerated electron-hole pair (17, 18) within the n-type HgCdTe layer 7. The photoconductive gain value for no recombination can be shown to be equal to the ratio of the electron mobility to the hole mobility.

In FIG. 1, the photoconductive gain value for the detector structure 5 can be defined as equal to the ratio of the electron 17 to the hole 18 mobilities because of the detector's 5 special structure. In conventional photoconductive detectors, the photoconductive gain is limited by the lift time of the hole 18. However, in the detector structure 5 in FIG. 1 facilitates conditions wherein electrons 17 and holes 18 are separated by an electric field produced by the gates 15, 15′. Thus, the hole 18 life time is significantly extended because separation of electrons 17 and holes 18 within the n-type HgCdTe layer 7 prevent electron 17 hole 18 recombination. Holes 18 can be removed or recombined at the negatively biased N+ diffusion region 8. Holes can also be removed as a special P+ contact incorporated in 7.

Similarly to the hole 18 removal, electrons 17 can be removed from the n-type HgCdTe layer 7 only through the positively biased N+ diffusion region 8'.

Hence, the number of electrons 17 removed for each photogenerated electron-hole pair (17, 18) is equal to the number of electrons 17 that can move across the n-type HgCdTe layer 7 in the time it takes a hole 18 to move across the same n-type HgCdTe layer 7. Because electrons 17 and holes 18 are subjected to the same electric fields, the number of electrons 17 transported for each hole 18 is equal to the mobility ratio of electron 17 to holes 18.

The electron to hole mobility ratio value is further increased by having the electrons 17 transported within the bulk or center of the HgCdTe layer 7 while the holes are transported at the interfaces 19, 19' or edges of the n-type HgCdTe layer 7. Mobility of holes transported at the interfaces 19, 19' should be less than the hole 18 mobility in the bulk of the n-type HgCdTe layer 7.

This photodetector structure 5 not only maximizes the photoconductive gain through electron 17 hole 18 separation, but also increases the resistance of the photodetector 5. An increased resistance between the N+ diffusion regions 8, 8' providing contact to the photodetector 5 is achieved because gates 15, 15' are depleting the n-type HgCdTe 7 layer of majority carriers. Depletion occurs from both surfaces 19, 19' toward the center of the n-type HgCdTe layer 7. As the majority carriers are depleted, the resistance of the photodetector 5 increases. This photodetector structure 5 is a high resistance photoconductive (HRPC) detector and this HRPC detector exhibits higher photoconductive gain as well as lower noise. Lower noise is achieved because the typical generation recombination noise in photoconductors is limited only to generation noise (lower noise by a factor of the $\sqrt{2}$) since the electron 17 and holes 18 are separated by the field produced by the depleting electrodes 15, 15' thereby inhibiting recombination.

FIG. 2 is an example of the preferred embodiment detector structure 21, showing the concept demonstrated in FIG. 1 with two additional features. Added to the structure shown in FIG. 1 is a substrate 24 transparent to infrared radiation. This substrate serves two purposes: (1) it provides mechanical support for the HRPC detectors since it is sufficiently thick to be handled during manufacture; and (2) it acts as a gate for depleting the N-type HgCdTe layer 7 of electrons 17 much like gate 15' performs for the HRPC detector in FIG. 1.

In FIG. 2, photons 20 strike the photoconductive detector 21 which comprises a substrate 24 of either p-doped cadmium telluride, (CdTe) p-doped cadmium magnesium telluride, (CdMnTe) p-doped indium antimonide (InSB), or p-doped zinc telluride (ZnTe), all of which have a predetermined bandwidth transparent to infrared radiation. This transparent substrate 24 supports a charge blocking insulator layer 16. The purpose of this layer 16 and layer 16' is the same as the layers shown in FIG. 1. The insulating layers 16, 16' prevent removal and transport of holes 18 and electrons 17 from the n-type HgCdTe photosensitive layer 7 into the substrate 24 and/or gate electrode 15. Layered upon the insulating layer 16 is a thin n-type mercury cadmium telluride (HgCdTe) or mercury zinc telluride (HgZnTe) film 7 with two N+ regions 8, 8' providing electrical contact. The band gap of the infrared photo absorbing layer 7 is narrower or smaller than the band gap of the substrate 24 and than the band gaps of the blocking insulator layers 16 and 16'. N+ doped regions 8' is connected to a ground potential 10, thus holes 18 will be attracted and move toward this terminal 8 while electrons 17 will flow toward the more positive biased region 8' connected to a B+ potential by a metal contact 9.

In the FIG. 2, the n-type doped region 7, including two N+ contract regions 8, 8', represent the photoconductive portion of the mercury cadmium telluride (HgCdTe) or mercury zinc telluride (HgZnTe) high resistance photoconductive detector (HRPC) structure 21. The mercury cadmium telluride N+ doped regions 8 and 8' are accessed by metal contacts 9, 9' such as indium. Layered upon the insulating layer 16' is a metal gate 15. This metal gate 15 is further operable to deplete free electron carriers 17 from the underlying n-type HgCdTe layer 7 when a negative bias is applied to contact 11 and to the substrate 24 via a metal contact 12. Also, in FIG. 2 either one or both insulating layers 16, 16' may be formed from combinations of p-type and n-type HgCdTe. Detector operation will remain unchanged.

FIG. 2A is an energy band diagram of the physical structure shown in FIG. 2. This band diagram demonstrates that photons 20 pass through the p-doped substrate 24 and insulating layers 16, 16' all of which have a wider band gap than the photo absorbing layer 7. It is evident from this energy band diagram that the infrared photo absorbing layer 7 has the smallest band gap of all the layers making up the high resistance photoconductive (HRPC) detector structure. The potential of the substrate 24 and metal gate 15 are adjusted to deplete this n-type HgCdTe layer 7 of majority carriers, electrons 17. As seen in 2A, electrons 17 within the photosensitive layer 7 will be localized in the middle of n-type HgCdTe layer 7 whereas holes 18, will be localized at the edges or interfaces 19, 19' of the same layer. The holes will be attracted to the substrate 24 and metal gate 15, but not removed by these structures because of the potential barriers formed by insulator regions 16 and 16'. These insulator regions will not only prevent the removal of holes 18 from the n-type HgCdTe photosensitive region 7 but will also block injection of any significant number of electrons 17 into region 7. A significant number of electrons 17 will not be injected because the insulating regions 16, 16' provide potential barriers for electron injection into region 7 and because the electron 17 concentration in the wide band gap insulators 16, 16' is extremely small.

FIG. 2B is an alternative embodiment of the FIG. 2, another high resistance photoconductive (HRPC) detector structure 22. A very thin conducting layer 14 is introduced for depletion of free electron carriers 17 from the n-doped HgCdTe photosensitive region 7. The transparent substrate 25 is topped by the very thin conducting layer 14 which is located below insulator 16, the thin infrared photosensitive film region 7, and a second insulator 16' and a metal gate 15 with contact 11. The thin conducting layers 14 and 15 provide means for depletion of the n-doped HgCdTe region 7 of electrons 17 thereby increasing the redsistance of the photo absorbing layer 7.

FIG. 3 is yet another embodiment of this invention high resistance photoconductive detector (HRPC) structure 23 which incorporates a resonant cavity structure, with two blocking regions 16, 16'. Each blocking region 16, 16' is made up on a combination of p-doped and n-doped layers 24/16, 16'/24'. The infrared energy 20 in the form of photons strikes the high resistance photoconductive (HRPC) detector from the back side of substrate 24. The substrate 24 is made of a sufficiently wide band gap material to be transparent to the infrared photons as absorbed in layer 7. These infrared photons are only absorbed by the n-type HgCdTe layer 7. Contact to the photo absoring layer 7 is achieved via two N+ regions 8, 8'. The high resistance photoconductive detector structure illustrated in FIG. 3 is configured for the long wavelength infrared spectrum with a 0.1 eV energy band gap specified for the infrared absorbing layer 7 and the blocking layers 24/16, 16'/24', all of which have an energy band gap wider than 0.1 eV. Mechanical support for this high resistance photoconductive structure is provided by the p-type substrate 24 approximately 20 mils thick, and of sufficient quality for epitaxial growth of multiple HgCdTe layers.

In FIG. 3, the first layer 16 grown epitaxially over the substrate 24 is a thin, approximately 1 μm, n-type HgCdTe layer 16 that forms a portion of the bottom blocking layer. The purpose of this blocking layer 16 is to prevent removal of electrons 17 or holes 18 from the infrared sensitive layer 7. The energy band gaps of the substrate 24 and the first n-type layer 16 overgrown, are selected to be wider than the energy band gap of the photo absorbing layer 7, thereby making these layers 24, 16 transparent to the detected infrared photons 20. It is important that free electron 17 concentration in the blocking layers 24/16, 16'/24' at the high resistance photoconductive (HRPC) detector's 23 operating temperature be very small. Such a low free electron 17 density condition in the blocking layers 24/16, 16'/24' can be achieved if the energy band gap of these blocking layers is made sufficiently wide.

Specifically, in FIG. 3 the energy band gap of the n-type blocking layers 16, 16' should have for example, a free electronic concentration significantly less than $10^{15}$ electrons/cm$^3$. The p-doped layers 24, 24' and the blocking regions 16, 16' should also be made sufficiently wide band gap material to be transparent to the infrared photons 20 being absorbed within these regions. Furthermore, the free hole 18 concentration should be sufficiently high in regions 24 and 24' to make the free electron 17 concentration in these regions extremely small. Contact to the p-doped blocking layers 24, 24' should be ohmic if possible and not with a metal that will form an n-doped type Schottky diode with the p-doped blocking layers 24, 24'. This restriction is necessary to prevent injection of electrons 17 from the metal gates or electrodes 12, 15 which contact respectively the p-type blocking layers 24, 24'. Injection of electrons 17 into these blocking layers 24, 24' will cause the injected electrons 17 to move into the infrared photo absorbing region 7, thereby corrupting the photogenerated signal produced by the infrared photons 20.

Figure 4:
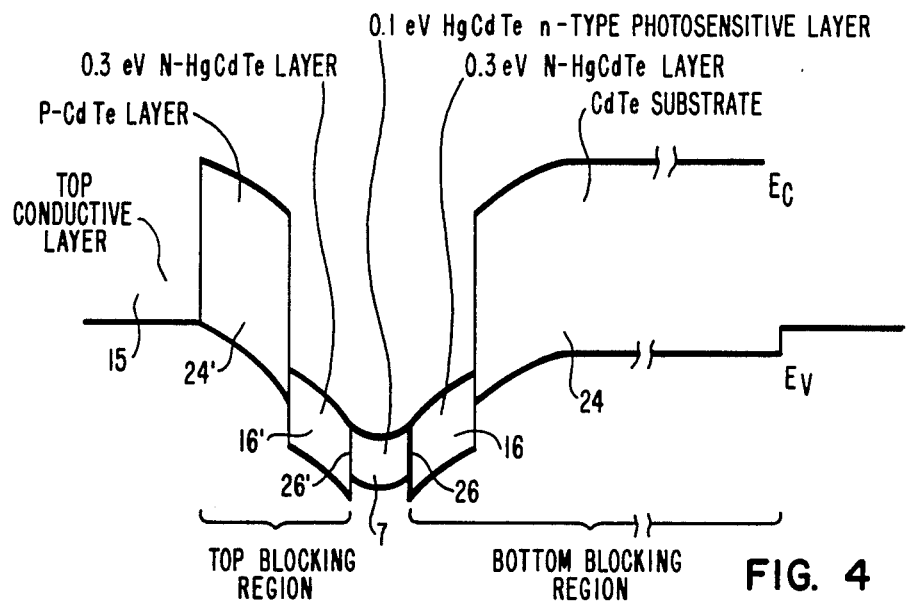
FIG. 4 is the band diagram of the embodiments as shown in FIGS. 3 and 5. In this diagram hole and electron blocking regions surround the n-type HgCdTe photosensitive layer. This photosensitive layer is located within $\lambda/4$ distance from the top conducting region providing the resonant cavity effect.

The operation of the blocking layers of FIG. 3 is best illustrated with an energy band gap diagram as shown in FIG. 4. Two blocking regions, 24/16 and 16'/24' are identified by the curly brackets at the base of this FIG. 4. The numbering sequence used for FIG. 4 is the same as in FIG. 3 to facilitate identification of the corresponding layers between these figures. Ohmic contact between the p-type blocking regions 24', 24 and contacting electrodes 15, 12 respectively will prevent electron 17 injection from the electrodes 15, 12 into the infrared photosensitve layer 7. Indium is the material advocated for making contact to n-type HgCdTe layer 7.

From FIG. 4 it should be clear, for those skilled in the art, that electron 17 injection from electrodes 15, 12 is blocked by the potential barriers formed by the p-type regions 24' and 24 respectively. Thus, no electrons 17 will be injected into the photo absorbing layer 7. Furthermore, no electrons 17 will be removed through these electrodes 15, 12 from the infrared photosensitive layer 7 because these electrodes 15, 12 are biased negative relative to the photo absorbing layer 7. The negative bias on these electrodes 12, 15 will cause the infrared photo absorbing region 7 to be depleted of majority carriers 17. Depletion will start from the two surfaces 19, 19' and progress toward the center as the fields increase, i.e., the negative bias is increased on electrodes 12, 15.

The combination of different band gap and doping materials in these embodiments results in the blocking of electron injection into and/or removal from the photo absorbing region 7 through the blocking layers 24'/16', 16/24. A similar condition exists for holes and this is achieved by augmenting the n-type layers 16, 16' with the p-type layers 24, 24' to make up the blocking regions. Since electrodes 15, 12 are biased negative relative to the photo absorbing layer 7 they attract holes.

From the energy band diagram in FIG. 4 it is clear that given the represented bias condition, holes will not be injected from electrodes 15, 12 into the infrared photo absorbing layer 7. Since electrodes 12, 15 are attractive for holes, provisions are included to prevent hole removal from the infrared photo absorbing layer 7. This is achieved by including two n-type layer 16 and 16' which form potential barriers at surfaces 19 and 19' thereby preventing hole removal from layer 7. Thus each blocking layer is made up of a combination of a n-type and p-type layer thereby providing for simultaneous hole and electron blocking.

A p-type, n-type blocking combination has been formulated to replace the function of an insulator for the explicit purpose of simplifying the fabrication of the high resistance photo conductive device. Unlike with insulating blocking layers, all the layers proposed for this embodiment can be epitaxially grown successively in a molecular beam epitaxy machine. The possibility of an epitaxial structure offered with the n-type, p-type blocking layer structure provides the means for growing higher quality infrared detectors than the detector structures that use exclusively insulator blocking layers. A hybrid structure where a n-type, p-type blocking structure is used as the bottom blocking region, and where an insulator is used as the top blocking region is viable and offers many desirable features.

The HRPC detector structure taught here includes structures wherein the top blocking layer is made of an insulator (e.g., $SiO_2$, ZnSe) and the bottom blocking layer is made of a p-type/n-type two layer combination. Specifically, for the hybrid detector structure, the top blocking layer is shown in FIG. 3 consisting of layers 16' and 24' can be replaced entirely by an insulating layer. Another possibility is that only layer 24' is replaced by an insulator leaving layer 16' thereby producing a top blocking layer consisting of layers 16' and an insulator in place of layer 24'. The advantage of this type of construction is that better surface passivation of layer 7 can be accomplished with an epitaxially overgrown wider energy band gap material than with an insulator. Thus, layer 16' will become the surface passivation layer while the carrier blocking function is re-established by using an insulator in place of layer 24'.

The geometry employed in the high resistance photoconductive detector utilizes optical resonant absorption phenomena. Use of this phenomena permits the achievement of high absorption quantum efficiency with a thinner photo absorbing layer, i.e., FIG. 3, layer 7; FIG. 2, layer 7. Use of a thinner photo absorbing layer 7, results in a smaller depletion field necessary to substantially deplete the photo absorbing layer 7 thereby further reducing the fields and potentials needed for operation. For long wavelength infrared detectors, this is very important because with lower fields interband tunneling and leakage current is reduced. Leakage and interband tunneling severely degrades the sensitivity of the detectors.

Figure 3A:
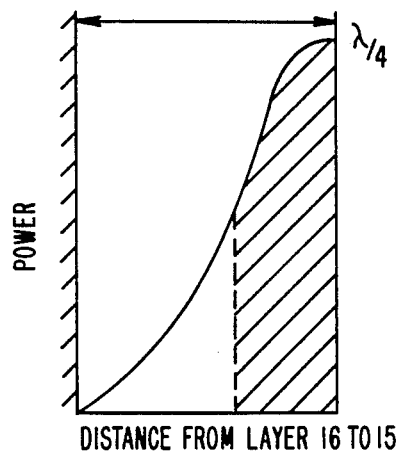
FIG. 3A is a graph demonstating the relationship between thickness of structure elements and power distribution inside a ¼ wavelength resonant optical cavity.

As shown in FIG. 3, for optimal operation, the photo absorbing layer 7 should be located within a specific, predetermined distance from a reflecting surface. The distance the photo absorbing layer 7 should be located from the optically reflecting surface is $N\lambda/4$ where N is an odd number and $\lambda$ is the wavelength equal to the center wavelength of the infrared absorption band. For widest absorption band, the value of N selected should be equal to unity. In FIG. 3 the optically reflecting surface 15 is for infared photons 20 being absorbed by layer 7. The photo absorbing layer 7 should be located within a $\lambda/4$ distance from the optically reflecting surface 15. Such a $\lambda/4$ distance is achieved by making the top blocking region, consisting of layers 16', 24' sufficiently thin to locate the infrared photo absorbing layer 7 within $\lambda/4$ from the optically reflecting surface 15. The increase in absorption power vs. distance possible is shown in FIG. 3A where the power absorbed by the detector 23 increases until the detector 23 is located a $\lambda/4$ distance from an optically reflecting surface 15.

Figure 3B:
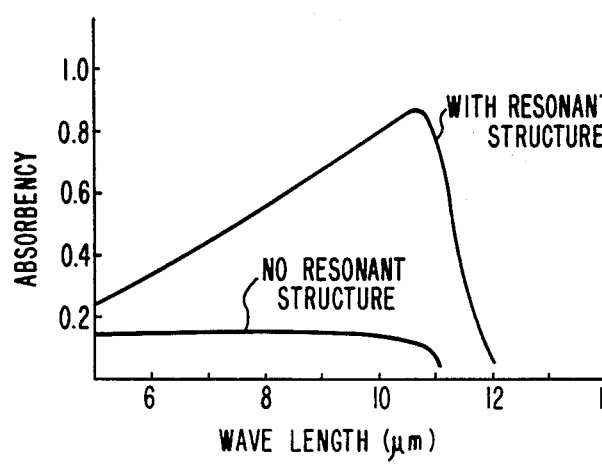
FIG. 3B is a graph demonstating the calculated absorbency spectra with a ¼ wave resonant optical cavity formed with an 8 to 12 micrometer mercury cadmium telluride photoconductor layer and the absorption spectra of a non-resonant structure having the same mercury cadmium telluride thickness.

FIG. 3B is the graph of the calculated absorptance spectra of $\frac{1}{4}$ wave ($\lambda$) resonant optical cavity for a 8 to 12 micrometer mercury cadmium telluride photoconductor 23 and that of a non-resonant structure with the same mercury cadmium telluride thickness. This graph of absorptance versus wavelength demonstrates a fivefold absorption improvement utilizing a resonant cavity and making this a detector suitable for longwave infrared imaging applications.

Figure 5:
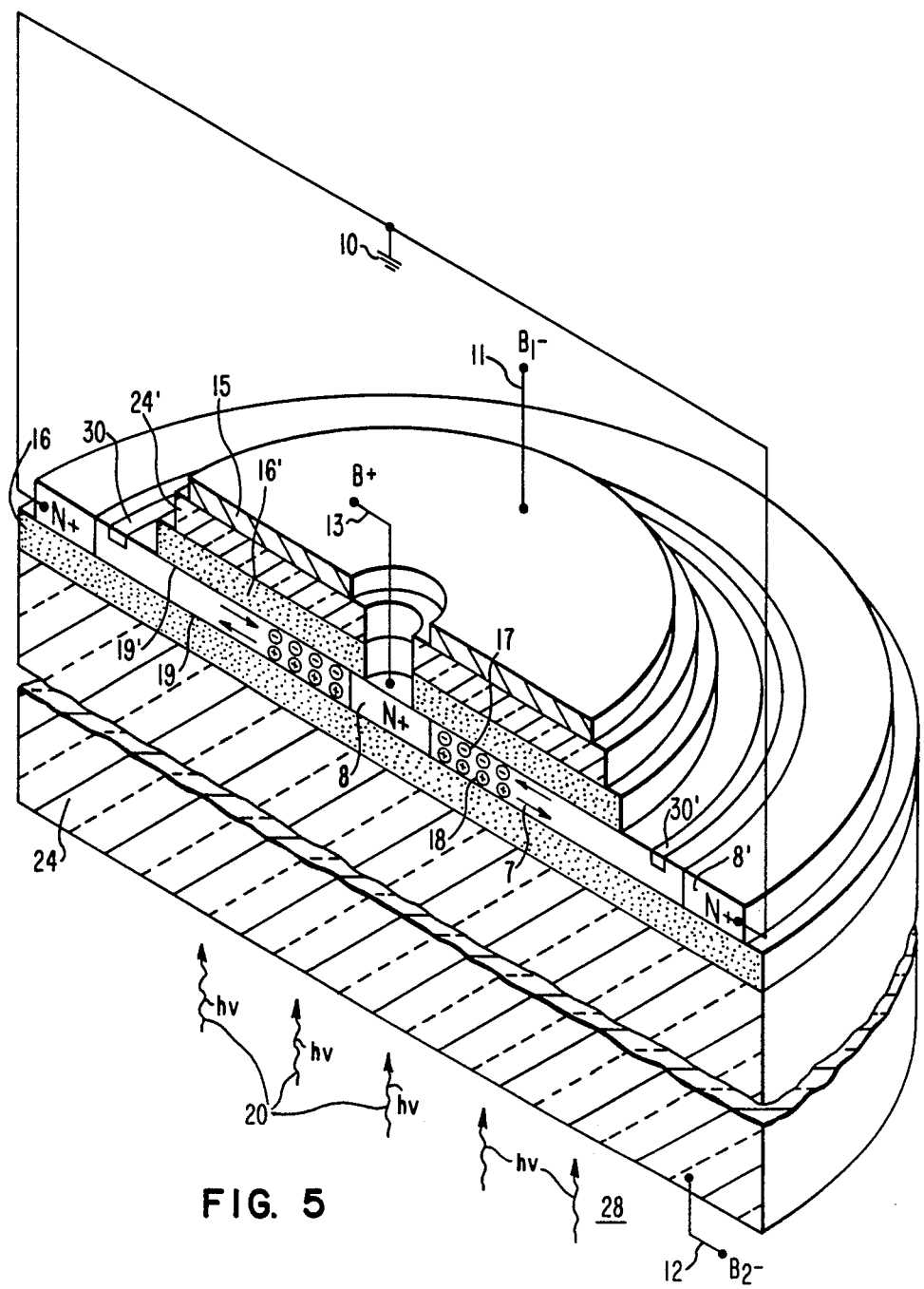
FIG. 5 is a cross section of a configuration for a high resistance photoconductor (HRPC) detector structure utilizing a circular geometry to circumvent lateral edge problems as associated with HRPC detector structure as shown in FIG. 3.

In FIG. 5, a cross section high resistance photoconductive structure as illustrated in FIGS. 1, 2, 2B and 3. The specific embodiment configuration shown here in FIG. 5 addresses the issue of edge leakage and other parasitic problems. As described in FIGS. 1, 2, 2B and 3 the high resistance photoconductive detector is illustrated by a profile where the photogenerated signal is obtained through two N+ contact regions 8, 8' to the photosensitive region 7. The two N+ contact regions 8, 8' represent only part of the high resistance photoconductive detector's periphery. The balance of the high resistance photoconductive detector's periphery is made up of two surfaces 27, 27' where each surface borders the high resistance photoconductive structure on one side and extends from one N+ region 8 to the other N+ contact region 8'. Clearly, these two peripheral surfaces 27, 27' may lead to edge shunting problems that cause degradation in the high resistance photoconductor's performance and characteristics. The geometry for the device in FIG. 5 discloses a means for eliminating the additional periphery present in high resistance photoconductive detector configured in FIGS. 1, 2. 2B and 3.

The technique for eliminating the additional periphery of surfaces 27, 27' utilizes circular symmetry for the high resistance photoconductive detector structure in FIGS. 1, 2, 2B or 3.

In FIG. 5, the rotation of any one of the detector structures (FIGS. 1, 2, 2B or 3) about one of the N+ contact region 8 of contact region 8' will form a new cylindrical structure 28 that has radial symmetry. In the center of the high resistance photoconductive structure 28 in FIG. 5 is an N+ region 8 biased positive relative to the N+ region 8' biased negative. The photo absorbing n-type HgCdTe layer 7 is located between the two N+ contact regions 8, 8' and is formed by diffusion of mercury or ion implantation of boron into these areas. An indium metal ground 10 can be used to make electrical contact to the two N+ regions 8, 8'. It should be re-emphasized that with the geometry illustrated in FIG. 5, detector edge or periphery problems between the two N+ regions 8, 8' have been severely minimized if not completely eliminated. Still existing, however, are surfaces 19, 19' between the two N+ regions 8, 8'.

Operation of the high resistance photoconductive detector structure 28 shown in FIG. 5 is the same as the detectors illustrated in FIGS. 1, 2, 2B and 3. However, for a given detector size, the distance between the two N+ regions 8, 8' providing contact to the high resistance photoconductor detector is halved relative to the corresponding distances shown in FIGS. 1, 2, 2B or 3. Thus, lower bias is necessary for operation of the detector illustrated in FIG. 5 and consequently faster operation is possible in this cylindrical-like configuration. It should be emphasized that one or both of the blocking layers 24/16 and 16'/24' as used in FIG. 5 may be replaced with insulating blocking layers. Also, the top blocking layer 16'/24' can be modified by the replacement of layer 24' only with an insulator. The numbering sequence used in FIG. 5 is the same sequence as the detector structure shown in FIG. 3 and the operation of both structures is the same.

In the discussion presented on the operation of the high resistance photoconductive (HRPC) detector the behavior of holes 18 and electrons 17 was considered. It was stated that electrons 17 are removed from the positive terminal 13 and injected through the negative or ground terminal 10 (see FIGS. 3, 5). Holes 18 should be removed through the negative terminal 10. However, if the depleting bias on gates 24, 16 is sufficiently high, special provisions will be needed for facilitating hole 18 removal from the photosensitive layer 7. Holes 18 will naturally move toward the negatively biased N+ region 8. Hole transport will occur at the surfaces 19, 19' and as they reach the N+ region they will encounter a potential barrier produced by the depleting action of the gates 24, 16. This potential barrier will cause the piling up the holes 18 against the barrier and thus retarding their flow to the negatively biased N+ region 8. The addition of P+ regions 30, 30' embedded in the photo absorbing layer 7 next to the N+ regions 8, 8' will further facilitate the removal of holes 18. The contact metal for this purpose can be gold. Removal of the holes 18 from near the negatively biased N+ region, 8, will prevent image lag or smear, i.e., a slower frequency response.

Figure 6:
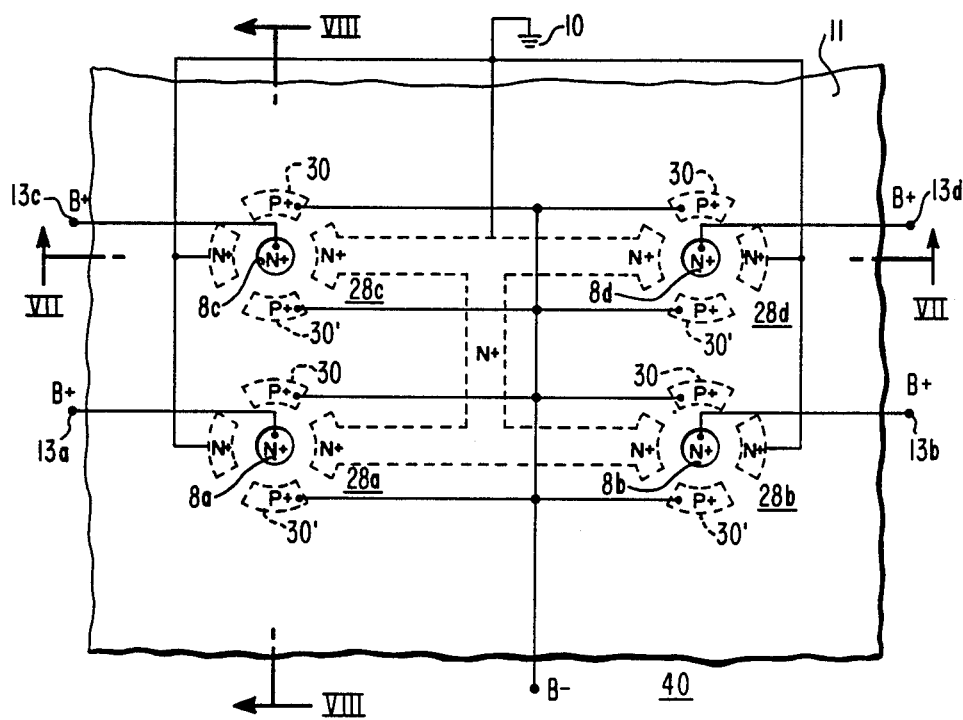
FIG. 6 is a plan view of an array of the high resistance photoconductor (HRPC) detector structure as shown in FIG. 3, having cross section VII, VII and VIII, VIII.

FIG. 6 is a plan view of a proposed array of detectors of the embodiment shown in FIG. 5. Four detectors 28a, 28b, 28c and 28d form an array 40 resting upon the surface of a substrate 24. This substrate 24 is transparent to photons 20 of infrared radiation and serves as a mechanical support for the array. Substrate 24 will be a p-doped semiconduction material such as cadmium telluride, cadmium manganese telluride, zinc telluride or indium antimonide layered upon substrate 24 will be a common layer of n-doped mercury cadmium telluride 16. One group of N+ regions in layer 7 all go to common ground 10. While another group of N+ regions, one within each detector 28a, 28b, 28c and 28d, serve as individual output nodes for the signals 13a, 13b, 13c and 13d respectively which are connected to the interior N+ region of each detector 8a, 8b, 8c, 8d.

Figure 7:
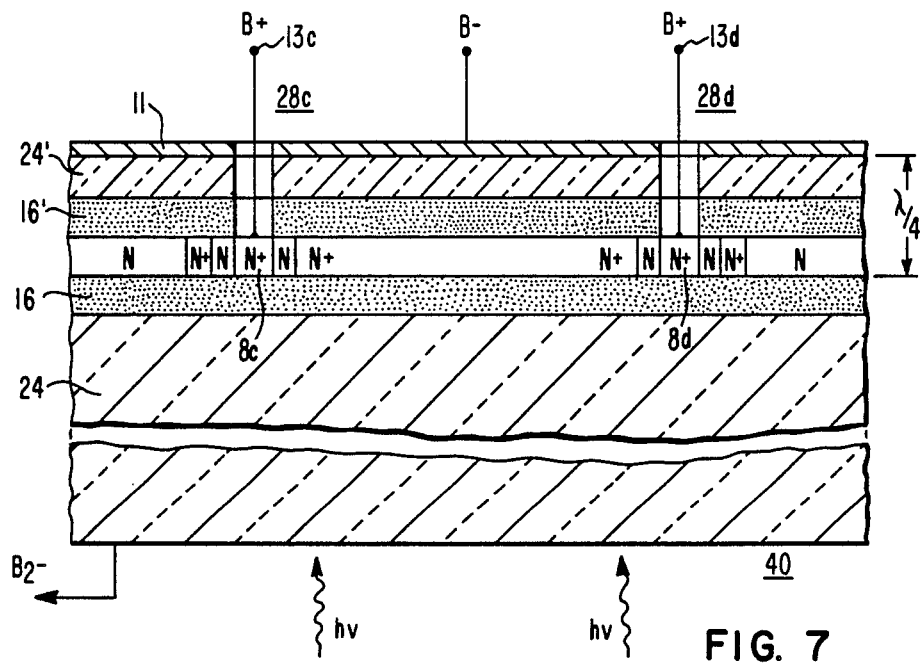
FIG. 7 is a cross section VII, VII of embodiment 5 array as shown as shown in FIG. 6.

FIG. 7 is a cross section view VII, VII as taken through detectors 28c and 28d on array 40. The common surface layers of n-doped HgCdTe 16' and p-doped CdTe 24' are shown in cross section VIII, VIII. The photoconductive layer 7 is sandwiched between the blocking or insulating layers of 16, 16'. Metal gate 11 is common to both detectors 28c and 28d. In FIG. 7, the photoconductive layer 7 is shown as detectors 28c and 28d as having alternating segments of n-doped-HgCdTe and N+ dopant regions 8c and 8d.

In this example of the preferred embodiment of array 40 the width of the layers 7, 16' and 24' combine to equal one-quarter of the wavelength of the frequency of energy the detector is designed to receive. These layers form a resonating function not unlike the concept of resonating cavities as used in optics. The efficiency of the devices shown in FIGS. 1, 2, 2B, 5 and 6 are significantly improved with the incorporation of precisely dimensioned layers 7, 16' and 24'.

Figure 8:
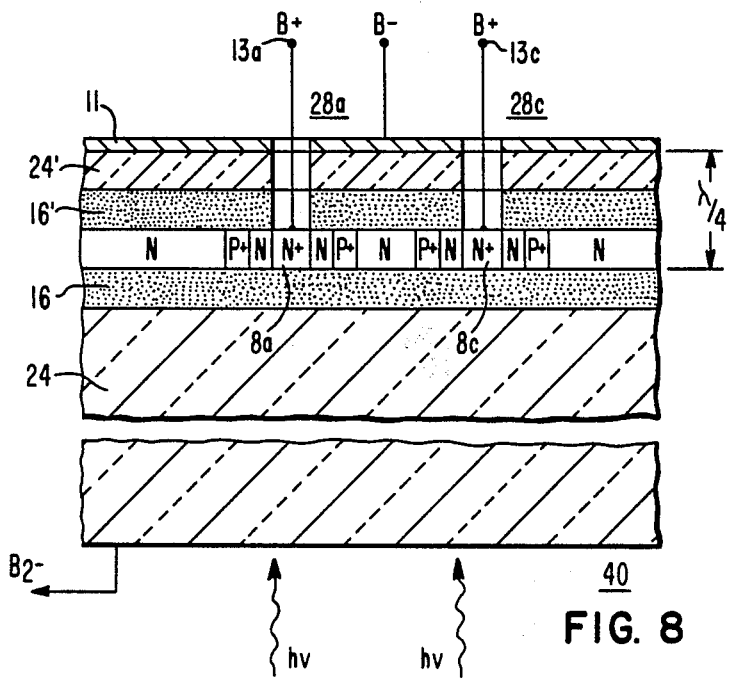
FIG. 8 is cross section VIII, VIII of embodiment array as shown in FIG. 6.

FIG. 8 is a cross section of array 40 taken across detector devices 28c and 28a. In this cross section the P+ doped regions 30, 30' are highlighted as they appear in layer 7. These P+ doped regions 30, 30' of detectors 28a, 28b, 28c and 28d serve to facilitate the migration and removal of holes 18 from the photoconductive layer 7. Layer 7 alternates n-doped HgCdTe with N+ doped regions to form the photoconductive layer and ohmic contacts respectively. Output signals 13c and 13a form devices 28c and 28a respectively and are shown interconnected to the N+ regions 8c and 8c. Again this cross section VIII, VIII shows the resonant structure of layers 7, 16' and 24'.

In summary, the concept disclosed in this application of a photoconductive layer, barrier regions with biased gates to facilitate electron and hole migration within the photoconductive layer, produces a multitude of embodiments. In its most elemental form the photoconductive device is functional with a minimum of support structure and resonating regions. Progressively complex variations of this device result in improved efficiency and performance. The final array comprising a multiplicity of photoconductive detector structures, showing common substrates and resonating barrier layers, utilizes a cylinder-like configuration to reduce edge shunting problems alleviating degradation in high resistance performance.

Numerous variations may be made in the above-described combination and different embodiments of this invention may be made without departing from the spirit thereof. Therefore, it is intended that all matter contained in the foregoing description and in the accompanying drawings shall be interpreted as illustrative and not in a limiting sense.

We claim:

1. A high resistance, thin film, photoconductive device, operable for use in high density multi-element photodetector arrays, comprising:
    a photoconductive layer of n-doped semiconductor material having a predetermined band gap, a first and second lateral face, and two opposing ends, said photoconductive layer further comprising a first and second N+ dopant region so positioned at the extreme of said two opposing ends of said photoconductive layer, said first and said second N+ dopant regions operable to serve as contact regions for said photoconductive layer, said photoconductive layer further operable to facilitate the migration of electrons and holes within said photoconductive layer;
    a first insulating layer positioned upon said first lateral face of said photoconductive layer, said first insulating layer operable to serve as a barrier for said electrons and said holes migrating within said photoconductive layer and said first insulating layer having a predetermined band gap;
    a second insulating layer positioned upon said second lateral face of said photoconductive layer, said second insulating layer operable to contain said electrons and said holes within said photoconductive layer, and said second insulating layer having a predetermined band gap;
    a ground means affixed to said first N+ dopant region operable to provide an electrical path to ground for said photoconductive device;
    a positive bias means affixed to said second N+ dopant region operable to provide positive electrical potential to said second N+ dopant region, whereby said second N+ dopant region is the most electrically positive region of said photoconductive layer; and,
    a metallic gate means layered upon said first and said second insulating layers, said electrical metallic gate means operable to place a negative electrical potential across said first insulating layer, said photoconductive layer and said second insulating layer whereby said electrons will migrate towards said positively biased second N+ dopant region, said electrons migrating within the bulk of said photoconductive layer and said holes migrating towards said ground means affixed to said first N+ dopant region along said first and said second lateral faces of said photoconductive layer, increasing said resistance of said photoconductive layer during photoconductive detector operation.

2. The photoconductive device as in claim 1 wherein the width of said photoconductive layer and said second insulating layer is one-quarter wavelength of the infrared radiation said device is operable to receive.

3. The photoconductive device as in claim 1, wherein said first insulating layer is n-doped mercury cadmium telluride (HgCdTe) and p-type mercury cadmium telluride (HgCdTe) having a band gap wider than said photoconductive layer.

4. The photoconductive device as in claim 1 wherein said second insulating layer is n-doped mercury cadmium telluride (HgCdTe) and p-type mercury cadmium telluride (HgCdTe) having a band gap wider than said photoconductive layer.

5. A high resistance, thin film, multi-layer photoconductive device, operable for use in high density, multi-element photodetector arrays, comprising:

a photoconductive layer of n-doped semiconductor material having a predetermined band gap, a first and a second lateral face, and two opposing ends, said photoconductive layer further comprising a first and a second N+ dopant region so positioned at the extreme of said two opposing ends of said photoconductive layer, said first and said second N+ dopant regions operable to serve as contact regions for said photoconductive layer, said photoconductive layer further operable to facilitate the migration of electrons and holes within said photoconductive layer;

a first insulating layer positioned upon said first lateral face of said photoconductive layer, said first insulating layer operable to serve as a barrier for said electrons and said holes migrating within said photoconductive layer, and said first insulating layer having a predetermined band gap;

a second insulating layer positioned upon said second lateral face of said photoconductive layer operable to contain said electrons and said holes within said photoconductive layer and said second insulating layer having a predetermined band gap;

a substrate layer of semiconductor material transparent to photons of infrared radiation, having a predetermined band gap, said substrate layer positioned upon said first insulating layer and operable to provide a mechanical support structure for said photoconductive layer, said substrate layer further operable to be negatively biased during said photoconductive device operation;

a ground means affixed to said first N+ dopant region operable to provide an electrical path to ground for said photoconductive device;

a positive bias means affixed to said second N+ dopant region operable to provide positive electrical potential to said second N+ dopant region, whereby said second N+ dopant region is the most electrically positive region of said photoconductive layer; and a metallic gate means layered upon said second insulating means, said metallic gate means operable when negatively biased in conjunction with said substrate layer to place a negative electrical potential across said first insulating layer, said photoconductive layer and said second insulating layer whereby said electrons will migrate towards said positively biased second N+ dopant region, said electrons migrating within the bulk of said photoconductive layer and said holes migrating towards said ground means affixed to said first N+ dopant region along said first and said second lateral faces of said photoconductive layer; thereby increasing said resistance of said photoconductive layer during photoconductive device operation.

6. A photoconductive device as in claim 5, wherein said first insulating layer is n-doped mercury cadmium telluride (HgCdTe) and p-type mercury cadmium telluride (HgCdTe).

7. A photoconductive device as in claim 5, wherein said second insulating layer is n-doped mercury cadmium telluride (HgCdTe) and p-type mercury cadmium telluride (HgCdTe).

8. A photoconductive device as in claim 5, wherein said substrate layer is p-doped indium antimonide (InSb).

9. A photoconductive device as in claim 5, wherein said substrate layer is p-doped cadmium manganese telluride (CdMnTe).

10. A photoconductive device as in claim 5, wherein said substrate layer is p-doped cadmium telluride (CdTe).

11. A photoconductive device as in claim 5, wherein said substrate layer is p-doped zinc telluride (ZnTe).

12. A photoconductive device as in claim 5, wherein said predetermined band gap of said photoconductive layer is narrower than said predetermined band gaps of said first, said second insulating layers and said substrate layer.

13. A photoconductive device as in claim 5, wherein said photoconductive layer comprises n-doped mercury cadmium telluride (HgCdTe).

14. A photoconductive device as in claim 5 wherein said photoconductive layer comprises n-doped mercury zinc telluride (HgZnTe).

15. A photoconductive device as in claim 5, wherein the combined thickness of said photoconductive layer and said second insulating layer is equal to one-quarter of the wavelength of the infrared radiation being detected.

16. A high resistance, thin film, multi-layer dual gate, photoconductive device, operable for use in high density, multi-element photodetector arrays, comprising:

a photoconductor layer of n-doped semiconductor material having a predetermined band gap, a first and a second lateral face, and two opposing ends, said photoconductive layer further comprising a first and a second N+ dopant region so positioned at the extreme of said two opposing ends of said photoconductive layer, said first and said second N+ dopant regions operable to serve as contact regions for said photoconductive layer, said photoconductive layer further operable to facilitate the migration of electrons and holes within said photoconductive layer;

a first insulating layer positioned upon said first lateral face of said photoconductive layer, said first insulating layer operable to serve as a barrier for said electrons and said holes migrating within said photoconductive layer and said first insulating layer having a predetermined band gap;

a second insulating layer positioned upon said second lateral face of said photoconductive layer operable to contain said electrons and said holes within said photoconductive layer, and said second insulating layer having a predetermined band gap;

a first metallic gate means layered upon said second insulating layer, said first electrical gate means operable to be negatively charged during detector operation;

a second metallic gate means layered upon said second electrical gate means operable to be negatively charged during detector operation;

a substrate layer of semiconductor material transparent to photons of infrared radiation, having a predetermined band gap, said substrate layer positioned upon said second electrical gate means and said substrate layer operable to provide a mechanical support structure for said photoconductive layer, said substrate layer having a predetermined band gap;

a ground means affixed to said first N+ dopant region operable to provide an electrical path to ground for said photoconductive device;

a positive bias means affixed to said second N+ dopant region operable to provide positive electrical potential to said second N+ dopant region, whereby said second N+ dopant region is the most electrically positive region of said photoconductive layer; and, an electrical bias voltage applied to said first and said second electrical gate means, such that a negative electrical potential is applied across said first and said second insulating means and said photoconductive layer whereby said electrons wil migrate towards said positively biased second N+ dopant region, and said electrons migrating within the bulk of said photoconductive layer and said holes migrating towards said ground means affixed to said first N+ dopant region along said first and said second lateral faces of said photoconductive layer; thereby increasing said resistance of said photoconductive layer during photoconductive device operation.

17. A photoconductive device as in claim 16, wherein said substrate layer is mercury cadmium telluride (HgCdTe).

18. A photoconductive device as in claim 16, wherein said first insulating layer is n-doped mercury cadmium telluride (HgCdTe) and p-type mercury cadmium telluride (HgCdTe).

19. A photoconductive device as in claim 16, wherein said second insulating layer is n-doped mercury cadmium telluride (HgCdTe) and p-type mercury cadmium telluride (HgCdTe).

20. A photoconductive device as in claim 16, wherein said photoconductive layer is n-doped mercury cadmium telluride (HgCdTe).

21. A photoconductive device as in claim 16, wherein said photoconductive layer is n-doped mercury zinc telluride (HgZnTe).

22. A photoconductive device as in claim 16, wherein the combined width of said first, said second insulating layers and said photoconductive layer are equal to one-quarter wavelength of the infrared radiation being detected.

23. A photoconductive device as in claim 16, wherein said band gap of said photoconductive layer is narrower than said predetermined band gaps of said first and said second insulating layer and said substrate layer.

24. A high resistance, thin film, multi-layer photoconductive device with resonator structure, operable for use in high density, multi-element photodetector arrays, comprising:

a photoconductive layer of n-doped semiconductor material having a predetermined band gap, a first and a second lateral face and two opposing ends, said photoconductive layer further comprising a first and a second N+ dopant region so positioned at the extreme of said two opposing ends of said photoconductive layer, said first and said second N+ dopant regions operable to serve as contact regions for said photoconductive layer, said photoconductive layer further operable to facilitate the migration of electrons and holes within said photoconductive layer;

a first insulating layer positioned upon said first lateral face of said photoconductive layer, said first insulating layer operable to serve as a barrier for said electrons and said holes migrating within said photoconductive layer, and said first insulating layer having a predetermined band gap;

a second insulating layer positioned upon said second lateral face of said photoconductive layer operable to contain said electrons and said holes within said photoconductive layer and said second insulating layer having a predetermined band gap;

a substrate layer of semiconductor material transparent to photons of infrared radiation, having a predetermined band gap, said substrate layer positioned upon said first insulating layer and operable to provide a mechanical support structure for said photoconductive layer, said substrate layer further operable to be negatively biased during said photoconductive device operation and said substrate layer having a predetermined band gap;

a resonating layer of semiconductor material positioned upon said second insulating layer, said resonating layer having a combined thickness with said second insulating layer and said photoconductive layer to be equal to one-quarter wavelength of the energy being received;

a ground means affixed to said first N+ dopant region operable to provide an electrical path to ground for said photoconductive device;

a positive bias means affixed to said second N+ dopant region operable to provide positive electrical potential to said second N+ dopant region, whereby said second N+ dopant region is the most electrically positive region of said photoconductive layer; and a metallic gate means layered upon said resonating layer, said electrical gate means operable when negatively biased in conjunction with said substrate layer to place a negative electrical potential across said first insulating layer, said photoconductive layer and said insulating layer whereby said electrons will migrate towards said positively biased second N+ dopant region, said electrons migrating within the bulk of said photoconductive layer and said holes migrating towards said ground means affixed to said first N+ dopant region along said first and said second lateral faces of said photoconductive layer thereby increasing said resistance of said photo-conductive layer during photoconductive device operation.

25. A photoconductive device as in claim 24, wherein said substrate layer comprises p-doped cadmium telluride (CdTe).

26. A photoconductive device as in claim 24, wherein said substrate layer comprises p-doped cadmium manganese telluride (CdMnTe).

27. A photoconductive device as in claim 24, wherein said substrate layer comprises p-doped indium antimonide (InSb).

28. A photoconductive device as in claim 24, wherein said substrate layer comprises p-doped zinc telluride (ZnTe).

29. A photoconductive device as in claim 24, wherein said first insulating layer comprises n-doped mercury cadmium telluride (HgCdTe) and p-type mercury cadmium telluride (HgCdTe).

30. A photoconductive device as in claim 24, wherein said second insulating layer comprises n-doped mercury cadmium telluride (HgCdTe) and p-type mercury cadmium telluride (HgCdTe).

31. A photoconductive device as in claim 24, wherein said resonating layer comprises p-doped cadmium telluride (CdTe).

32. A photoconductive device as in claim 24, wherein said predetermined band gap of said photoconductive layer is narrower than said predetermined band gaps of said first and said second insulating layers, said substrate layer and said resonating layer.

33. A cylindrical high resistance, thin film photoconductive device, operable for use in high resistance, high density multi-element detector arrays, comprising:

a disk-shaped, photoconductive layer of n-doped semiconductor material having a predetermined band gap, a first and second lateral face, a circular external periphery and a predetermined width;

said photoconductive layer further comprising a first N+ dopant region so positioned in the center of said disk-shaped photoconductive layer, and said second N+ dopant region so positioned about said circular external periphery of said photoconductive layer;

said disk-shaped photoconductive layer further comprising a first and a second P+ dopant region so positioned between said first N+ dopant region and said second N+ dopant region operable to provide electrical contacts for said photoconductive layer;

said semiconductor photoconductive layer operable to facilitate the migration of electrons and holes within said photoconductive layer;

a disk-shaped, first insulating layer positioned upon said first lateral face of said disk-shaped photoconductive layer, comprising n-doped semiconductor material, said first insulating layer having a predetermined band gap, operable to serve as a barrier for said electrons and said holes in said photoconductive layer;

a disk-shaped, second insulating layer positioned upon said second lateral face of said disk-shaped photoconductive layer, said second insulating layer, said second insulating layer having a predetermined band gap, said second insulating layer further comprising n-doped semiconductor material and operable during said photocnductive device operation to serve as a barrier for said electrons and said holes in said photoconductive layer;

a disk-shaped substrate layer of p-doped semiconductor material having a predetermined band gap and a diameter greater than said diameter of said first insulating layer, said disk-shaped substrate layer further operable to be transparent to photons of infrared radiation and further operable to provide a mechanical support structure for said photoconductive device, said substrate layer also operable to be negatively biased during said photoconductive device operation;

a disk-shaped resonating layer of p-doped semiconductor material positioned upon said second insulating layer, said resonating layer having a diameter less than said diameter of said second insulating layer, said resonating layer having a width where combined with the width of said photoconductive and said second insulating layer of one-quarter wavelength of the radiant energy of said photoconductive device is operable to receive;

a ground means affixed to said second N+ dopant region of said photoconductive layer operable to provide an electrical path to ground for said photoconductive device;

a positive bias means affixed to said first N+ dopant region operable to provide positive electrical potential to said first N+ dopant region, whereby said first N+ dopant region is the most electrically positive region of said photoconductive layers, a disk-shaped metallic gate means layered upon said disk-shaped resonating layer, said disk-shaped metallic gate having a diameter less than said diameter of said resonating layer, said metallic gate means operable when negatively biased in conjunction with said disk-shaped substrate layer to place a negative electrical potential across said first insulating layer, said photoconductive layer, said second insulating layer and said resonating layer whereby said electrons will migrate towards said positively biased first N+ dopant region, said electrons migrating within the bulk of said photoconductive layer and said holes migrating towards said ground means affixed to said second N+ dopant region in said photoconductive layer, along said first and said second lateral faces of said photoconductive layer, thereby increasing said resistance of said photoconductive layer during said photoconductive device operation.

34. A photoconductive device as in claim 33 wherein said substrate layer is p-doped cadmium telluride (CdTe).

35. A photoconductive device as in claim 33 wherein said substrate layer is p-doped cadmium manganese telluride (CdMnTe).

36. A photoconductive device as in claim 33 wherein said substrate layer is p-doped indium atinomide (IbSb).

37. A photoconductive device as in claim 33 wherein said first insulating layer is n-doped mercury cadmium telluride (HgCdTe).

38. A photoconductive device as in claim 33 wherein said photoconductive layer is n-doped mercury cadmium telluride (HgCdTe).

39. A photoconductive device as in claim 33 wherein said second insulating layer is mercury cadmium telluride (HgCdTe).

40. A photoconductive device as in claim 33 wherein said resonating layer is p-doped cadmium telluride (CdTe).

41. A photoconductive device as in claim 33 wherein said band gap of said photoconductive layer is a narrower band gap than the band gaps of said substrate, first insulating, second insulating and resonating layers.

42. A planar, high resistance, thin film photoconductive array, having a multiplicity of cylindrical photoconductive devices impregnated therein, said photoconductive array operable to detect predetermined wavelengths of external infrared radiation, comprising:

a shared common substrate layer of p-doped semiconductor material, said common substrate layer having a predetermined band gap, said common substrate layer further transparent to photons of infrared radiation and operable to receive said photons, and further operable to provide a mechanical support structure for said multiplicity of cylindrical photoconductive devices, said common substrate layer further operable to be negatively biased during said array operation;

a common first insulating layer, positioned upon said common substrate layer, said common first insulating layer operable to serve as a barrier for electrons and holes, said common first insulating layer having a predetermined band gap;

a photoconductive layer positioned upon said common first insulating layer having a predetermined band gap, said photoconductive layer comprising alternating regions of n-doped semiconductor material, N+ doped semiconductor material and P+ doped regions of semiconductor material, said alternating regions positioned within said photoconductive layer in a circular configuration; said photoconductive layer operable to facilitate the migration of electrons and holes within said semiconductor layer;

a second common insulating layer of n-doped semiconductor material positioned over said photoconductive layer having a predetermined band gap, said second insulating layer operable to contain said electrons and said holes within said photoconductive layer, said second common insulating layer, selectively removed from said photoconductive layer to facilitate electrical contact with said arrays;

a common resonating layer of p-doped semiconductor material having a predetermined band gap, said common resonating layer having, when combined with said photoconductor layer, a depth of approximately one-quarter of the wavelength of said infrared radiation received, said common resonating layers electrically removed over said arrays to facilitate electrical contact with said arrays;

metal gate layer positioned upon said common resonating layer, said gate layer operable to be negatively biased during detector operation;

a ground means affixed to selected first N+ doped regions of said photoconductive layer, said ground means interconnecting said devices in said array, said ground means operable to provide an electrical path to ground for said devices in said photoconductive layer;

a positive bias means affixed to selected said second N+ dopant areas in said photoconductive layer, said positive bias means operable to provide positive electrical potential to said second N+ dopant region, whereby said selected second N+ dopant regions are the most electrically positive regions of said photoconductive layer such that during array operation said electrons in said photoconductive layer will migrate towards said positively biased second N+ dopant regions, and said electrons migrating in the bulk of said photoconductive layer, and said holes migrate towards said ground means affixed to said other selected first N+ doped regions in said photoconductive layer during photoconductive device array operation.

43. A photoconductive multi-device array as in claim 42, wherein said shared common substrate layer is p-doped cadmium telluride (CdTe).

44. A photoconductive multi-device array as in claim 42, wherein said common substrate layer is p-doped cadmium manganese telluride (CdMnTe).

45. A photoconductive multi-device array as in claim 42, wherein said common first insulating layer is n-doped mercury cadmium telluride (HgCdTe).

46. A photoconductive multi-device array as in claim 42, wherein said photoconductive layer is n-doped mercury cadmium telluride (HgCdTe).

47. A photoconductive multi-device array as in claim 42, wherein said resonating layer is p-doped cadmium telluride (CdTe).

48. A photoconductive multi-device array as in claim 42, wherein said band gap of said photoconductive layer is a narrower band gap than the band gaps of said common substrate, said first insulating said second insulating and said resonating layers.

* * * * *